United States Patent
Czamara et al.

(10) Patent No.: US 9,438,087 B2
(45) Date of Patent: *Sep. 6, 2016

(54) ENERGY RECLAMATION FROM AIR-MOVING SYSTEMS

(71) Applicant: Amazon Technologies, Inc., Reno, NV (US)

(72) Inventors: Michael Phillip Czamara, Seattle, WA (US); Brock Robert Gardner, Seattle, WA (US); Osvaldo P. Morales, Seattle, WA (US)

(73) Assignee: Amazon Technologies, Inc., Reno, NV (US)

(*) Notice: Subject to any disclaimer, the term of this patent is extended or adjusted under 35 U.S.C. 154(b) by 0 days.

This patent is subject to a terminal disclaimer.

(21) Appl. No.: 14/605,818

(22) Filed: Jan. 26, 2015

(65) Prior Publication Data

US 2015/0162801 A1    Jun. 11, 2015

Related U.S. Application Data

(63) Continuation of application No. 13/632,766, filed on Oct. 1, 2012, now Pat. No. 8,941,256.

(51) Int. Cl.
| | |
|---|---|
| F03D 9/00 | (2016.01) |
| H02K 7/18 | (2006.01) |
| F03D 1/04 | (2006.01) |
| H05K 7/20 | (2006.01) |
| H02J 7/34 | (2006.01) |

(52) U.S. Cl.
CPC ............ *H02K 7/1823* (2013.01); *F03D 1/04* (2013.01); *F03D 9/00* (2013.01); *H02J 7/34* (2013.01); *H05K 7/20745* (2013.01); *F05B 2220/602* (2013.01); *F05B 2260/24* (2013.01); *Y02E 10/465* (2013.01); *Y02E 10/725* (2013.01)

(58) Field of Classification Search
CPC ................. F05B 2220/602; F05B 2220/604; Y02B 10/30; Y02B 10/70
USPC ............ 290/52, 55, 44; 415/21; 361/679.47, 361/679.49, 690, 694, 695; 60/398
See application file for complete search history.

(56) References Cited

U.S. PATENT DOCUMENTS

| | | |
|---|---|---|
| 7,200,005 B2 | 4/2007 | Von Gutfeld et al. |
| 8,013,465 B2 | 9/2011 | Gilbert |
| 8,941,256 B1 | 1/2015 | Czamara et al. |
| 2009/0097205 A1 | 4/2009 | Matsushima et al. |
| 2009/0251860 A1 | 10/2009 | Belady et al. |
| 2011/0058929 A1 | 3/2011 | Smith et al. |
| 2011/0278928 A1 | 11/2011 | Burger et al. |
| 2011/0316337 A1 | 12/2011 | Pelio et al. |
| 2013/0026761 A1 | 1/2013 | Rajadhyaksha et al. |

OTHER PUBLICATIONS

U.S. Appl. No. 13f659,644, filed Oct. 24,2012, Brock Robert Gardner.
U.S. Appl. No. 13f655,301, filed Oct. 18, 2012, Jerry James Hunter.
Martin Anyi, Brian Kirke "Evaluation of small axial flow hydrokinetic turbines for remote communities" Energy for Sustainable Development 14 (2010) pp. 110-116.
"Hydro-Electric-Barrel Generator" published Jul. 29, 2012 on www.hydro-electric-barrel.com/index, 1 page.
Whitepaper: "In-Stream Hydrokinetic Turbines" published Jul. 29, 2012 pp. 1-6.

*Primary Examiner* — Vanessa Girardi
(74) *Attorney, Agent, or Firm* — Robert C. Kowert; Meyertons, Hood, Kivlin, Kowert & Goetzel, P.C.

(57) ABSTRACT

A data center includes a computing room, computing devices in the computing room, an air handling system, and a turbine system. Air moved by the air handling system flows across heat producing components in the computing devices in the computing room. A rotor of the turbine system rotates in response to at least a portion of the air moved by the air handling system. The turbine system generates electricity from rotation of the rotor.

20 Claims, 8 Drawing Sheets

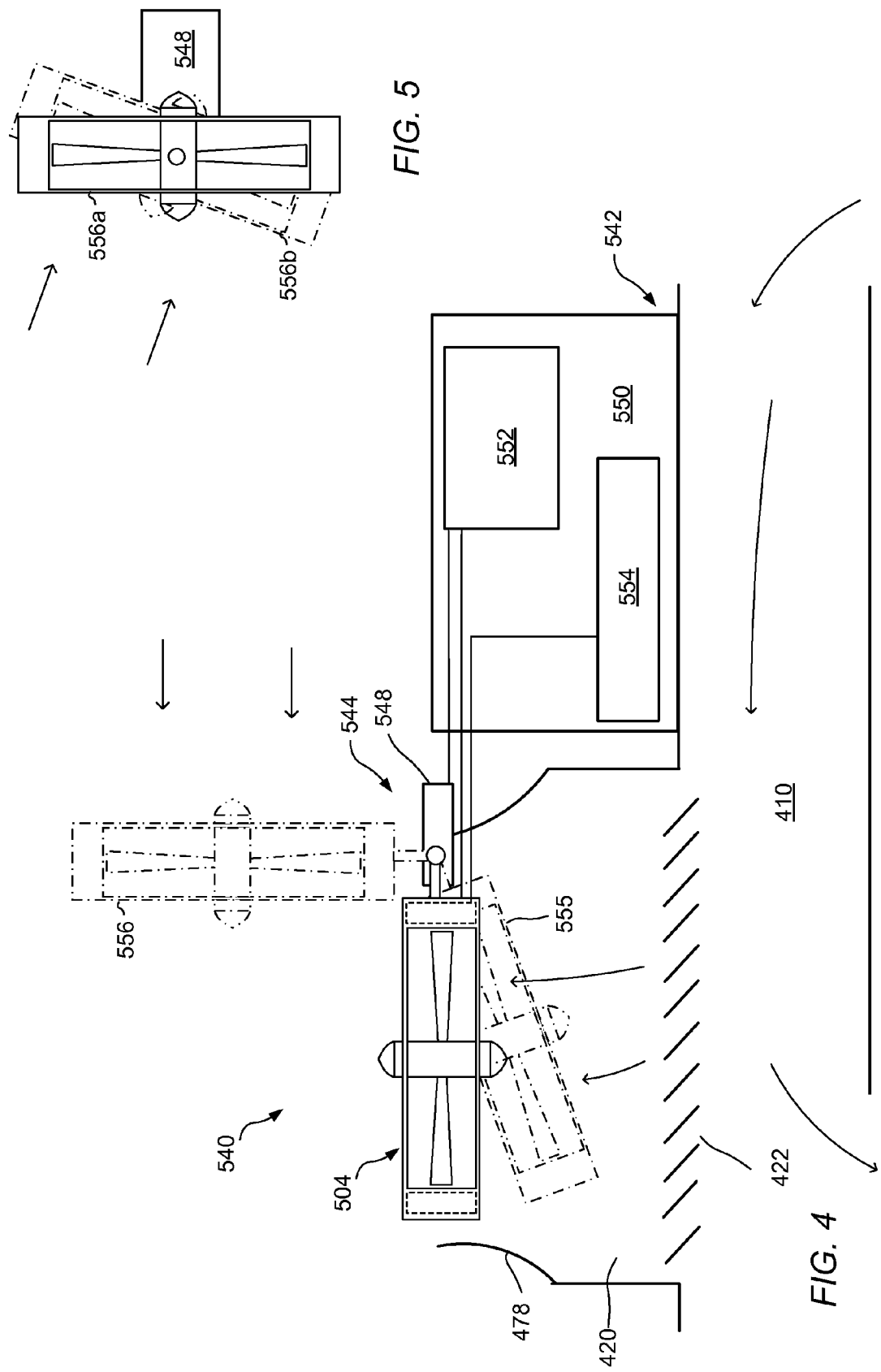

ENERGY RECLAMATION FROM AIR-MOVING SYSTEMS

This application is a continuation of U.S. patent application Ser. No. 13/632,766, filed Oct. 1, 2012, now U.S. Pat. No. 8,941,256, which is hereby incorporated by reference in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data centers rely on forced air systems and air conditioning to maintain the temperatures and other environmental conditions in the data center within acceptable limits. The initial and ongoing costs of installing and operating these systems may add substantial cost and complexity to data center operations. In addition, in many data centers, the forced air systems and air conditioning may be relatively inefficient in that a substantial amount of energy is wasted (for example, dissipated to the surroundings in the form of heat and exhaust flow kinetic energy.)

Data centers often include components and systems to provide back-up power to servers in the event of a failure of components or systems in a primary power system. Providing full redundancy of electrical power for a data center may, however, be costly both in terms of capital costs (in that in may require a large number of expensive switchboard, UPSs, and PDUs, for example) and in terms of costs of operation and maintenance. In addition, some data centers do not provide redundant power for all cooling systems.

BRIEF DESCRIPTION OF THE DRAWINGS

FIG. 4 illustrates a turbine system including a mechanism for adjusting the orientation of a rotor.

FIG. 5 is a top view of a data center illustrating adjustment of the orientation of a turbine about a vertical axis.

Figure 1:
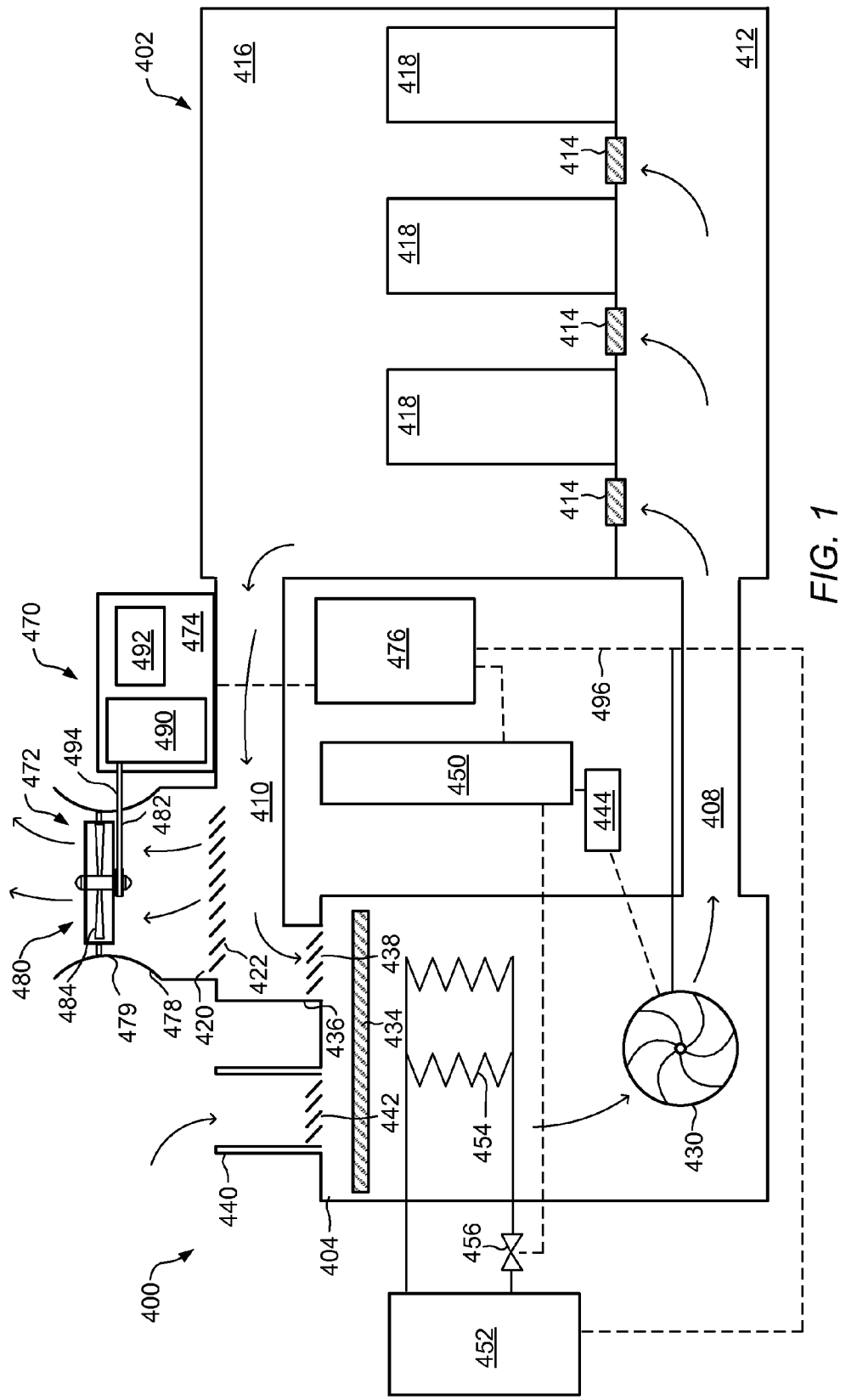
FIG. 1 is a block diagram illustrating one embodiment of a data center including a turbine system for reclaiming energy from moving air.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for reclaiming or recovering energy from moving air are disclosed. According to one embodiment, a data center includes a computing room, computing devices in the computing room, an air handling system, and a turbine system. Air moved by the air handling system flows across heat producing components in the computing devices in the computing room. A rotor of the turbine system rotates in response to at least a portion of the air moved by the air handling system. The turbine system generates electricity from rotation of the rotor.

According to one embodiment, a system includes one or more rooms and an air handling system that moves air through the rooms. A rotor of the turbine system rotates in response to air moved by the air handling system. The turbine system generates electricity from rotation of the rotor.

According to one embodiment, air is moved through an enclosed space to control conditions of the air in the enclosed space. At least a portion of the air is moved a through a rotor of a turbine system such that a rotor of the turbine system rotates. Electrical power is generated from the rotation of the rotor.

As used herein, "air handling system" means a system that provides or moves air to, or removes air from, one or more systems or components.

As used herein, "duct" means a tube, channel, pipe, or fluid carrier that can direct or channel a gas, such as air, from one location to another. A duct may have any cross section, including square, rectangular, circular, ovate, or irregular. A duct may have a uniform cross sectional area over its length or a varying cross sectional area over its length. A duct may, for example, include a converging section in which the cross sectional area of the duct decreases, a diverging section in which the cross sectional area of the duct increases, or both.

As used herein, "exhaust" means air that is being exhausted or expelled from an air handling system (for example, to outside air).

As used herein, a "turbine" means a device or system that produces rotary motion from a moving fluid. Examples of turbine types include a blade turbine, helix turbine, bladeless turbine, and statorless turbine. A turbine may be shrouded or unshrouded.

As used herein, a "turbine system" means a system that includes one or more turbines.

As used herein, a "rotor" means a rotating part of a device or system.

As used herein, "infrastructure" means systems, components, or elements of a system that provide resources for a computing device, such as electrical power, data exchange capability with external systems, air, heat removal, and environmental control (for example, humidity control, particulate control).

As used herein, an "aisle" means a space next to one or more racks.

As used herein, "air moving device" includes any device, element, system, or combination thereof that can move air. Examples of air moving devices include fans, blowers, and compressed air systems.

As used herein, "ambient" refers to a condition of outside air at the location of a system or data center. An ambient temperature may be taken, for example, at or near an intake hood of an air handling system.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "free cooling" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, a "hot aisle" means an aisle into which heated air can be discharged for use in removing heat from a system, such as a rack computing system.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "rack computing systems" means a computing system that includes one or more computing devices mounted in a rack.

As used herein, "reserve power" means power that can be supplied to an electrical load upon the failure of, or as a substitute for, primary power to the load.

As used herein, "room" means a room or a space of a building. As used herein, "computer room" means a room of a building in which computing devices, such as rack-mounted servers, are operated.

As used herein, a "space" means a space, area or volume.

In various embodiments, a system includes a turbine system that generates electricity from air moved by an air handling system. FIG. 1 is a block diagram illustrating one embodiment of a data center including a turbine system for reclaiming energy from moving air. Cooling system 400 may remove heat from data center 402. In the embodiment illustrated in FIG. 1, cooling system 400 includes air handling sub-systems 404. Air handling sub-systems 404 may provide cooling air to data center 402.

For illustrative purposes, only one air handling sub-system 404 is shown in FIG. 1. The number of air handling sub-systems 404 in cooling system 400 may vary, however. In some embodiments, cooling system 400 includes many air handling sub-systems 404. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center is provided with outside air vents. For example, half the air handling systems at a data center may have both outside air vents and return air vents, while the other half the air handling systems at a data center have only return air vents.

Each air handling sub-system 404 may be coupled to data center 402 by supply duct 408 and return duct 410. Cooling air may flow from air handling sub-system 404 through supply duct 408 into plenum 412. From plenum 412, cooling air may pass through flow restriction devices 414 into room 416. Cooling air may pass over racks 418. After the air is heated by racks 418, the air may pass through return duct 410. Air may be recirculated through one or more air handling sub-systems or discharged from the system through exhaust vent 420. Exhaust vent 420 includes exhaust damper 422.

Air handling sub-system 404 includes fan 430, humidifier 432, filter 434, return air vent 436, return air damper 438, outside air vent 440, and outside air damper 442. Fan 430 is coupled to VFD 444. VFD 444 is coupled to control unit 450. Control of fan 430 may be, for example, as described above relative to FIG. 1. Return air vent 438 may receive air returning from data center 102 through return duct 410. Outside air vent 440 may receive outside air.

Cooling system 400 includes chilled water subsystems 452. Chilled water subsystems 452 may be coupled in heat transfer communication with air handling sub-systems 404. Chilled water sub-system 452 includes coils 454 and valve 456. Valve 456 is coupled to control unit 450. Valve 456 may be opened and closed by signals from control unit 450. The position of valve 456 may be used to regulate the use of chilled water to cool air in air handling sub-system 404. In one embodiment, a common chilled water subsystem 452 provides chilled water to two more of air handling sub-systems 404. In certain embodiments, each air handling sub-system 404 is cooled by a dedicated chilled water subsystem 452.

In some embodiments, chilled water subsystems 452 are coupled to a chilled water heat removal system. Examples of chilled water heat removal systems include a service water subsystem, air-conditions refrigerant sub-system, or a cooling tower sub-system.

Control unit 450 may be programmed to control devices in handling sub-systems 404 and/or chilled water sub-systems 452. Control unit 450 is coupled to fan 430, humidifier 432, return air damper 438, outside air damper 442, and exhaust damper 422. Control unit 450 is in data communication with temperature sensors, pressure sensors, or both. In one embodiment, all of air handling sub-systems 404 and chilled-water sub-systems are controlled with a common control unit (e.g., control unit 450). In other embodiments, separate controllers are provided for each air handling sub-system 404 and chilled water sub-systems 452, or for a subset of the air handling sub-systems 404 and/or chilled water sub-systems 452. Devices in air handling sub-systems 404 and chilled water sub-systems 452 may be controlled automatically, manually, or a combination thereof.

In the embodiment shown in FIG. 1, air handling sub-system 404 may force air through supply duct 408 into plenum 412. In other embodiments, cooling air may be forced directly into room 416 through a supply duct without going through a plenum. In various embodiments, flow restriction devices 414 may be chosen to control the flow rates and distribution of cooling air among various racks 418 in room 416.

In certain embodiments, a control unit includes at least one programmable logic controller. The PLC may, among other things, regulate air moving devices and open and close valves or dampers in cooling air systems based upon command signals from an operator to move air flow through a data center as necessary for the prevailing operational conditions. Alternatively, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

In various embodiments, operation of one or more air handling systems may be controlled in response to one or more conditions. For example, control system 128 may be programmed to increase the speed of some or all of air moving devices when one or more predetermined conditions are met, such as temperature and humidity.

In various embodiments, operation of one or more air handling sub-systems of a cooling system may be controlled in response to one or more conditions. For example, the controller may be programmed to switch the air source for an air-handling sub-system from return air to outside air when one or more predetermined conditions are met, such as temperature and humidity.

Cooling system 400 includes turbine system 470. Turbine system 470 includes turbine 472, generator unit 474, and energy storage system 476. Turbine 472 is installed in duct 478. Turbine 472 includes rotor 480 and turbine housing 482. Rotor 480 includes blades 484. Rotor 480 may is coupled to rotation on housing 482. Rotor 480 may rotate in response to air passing through duct 478.

Generator unit 474 includes generator 490 and turbine system controller 492. Generator 490 is coupled to turbine 472 by way of drive system 494. Drive system 494 may include elements that link an output shaft of rotor 480 to an input shaft in generator 490. Elements linking a rotor to a generator may include, for example, one or more sheaves coupled to one another by way a belt or chain.

In some embodiments, elements of drive system 494 are selected to control a ratio for rotation of a rotor shaft relative to a generator shaft. For example, a sheave and belt system may be used to establish a 10:1 ratio between an input shaft of generator 490 and an output shaft of rotor 480. In certain embodiments, a turbine system includes a gearbox for controlling a ratio between rotation of a rotor and a generator shaft.

In some embodiments, turbine system 470 is operated to generate electricity from air being expelled from cooling system. For example, when exhaust dampers 422 are open, a portion of the air moving through cooling system 400 may be exhausted to the outside via duct 478. As air flows through duct 478, rotor 480 may turn within in housing 482. Rotation of rotor 480 may drive generator 490 to product electricity. Energy from the electricity may be stored in energy storage device 476.

In some embodiments, turbine system controller 492 controls operation of turbine system 470 to generate electricity from moving air in cooling system 400. In one embodiment, turbine system controller 492 includes a programmable logic controller. Turbine system controller 492 may control, for example, whether turbine system 470 is on or off, a rate of charging of energy storage device, or a gear ratio between rotor 480 and an input shaft of generator 490.

In some embodiments, electrical energy generated from a turbine coupled to a cooling air system is used to provide electrical power for operating components of the cooling system. For example, electrical energy storage device 476 may be used to supply power to controller 450, air moving device 430, or components of chilled water sub-system 452. In some embodiments, electrical energy storage device 476 serves as a back-up electrical power system for cooling system 400. In one embodiment, electrical energy storage device 476 is part of an uninterruptible power supply.

In some embodiments, air flow to a turbine is controlled to promote electricity generation. In one embodiment, air is channeled through a passage having a decreasing cross sectional area such that the velocity of air is higher when it passes through a turbine. For example, duct 478 converges to neck 479. The intake of turbine is at a reduced cross section part of duct 478, in this case, neck 479. The velocity of air flowing through duct 478 at neck 479 is higher than the velocity of the air entering exhaust vent 420.

Figure 2:
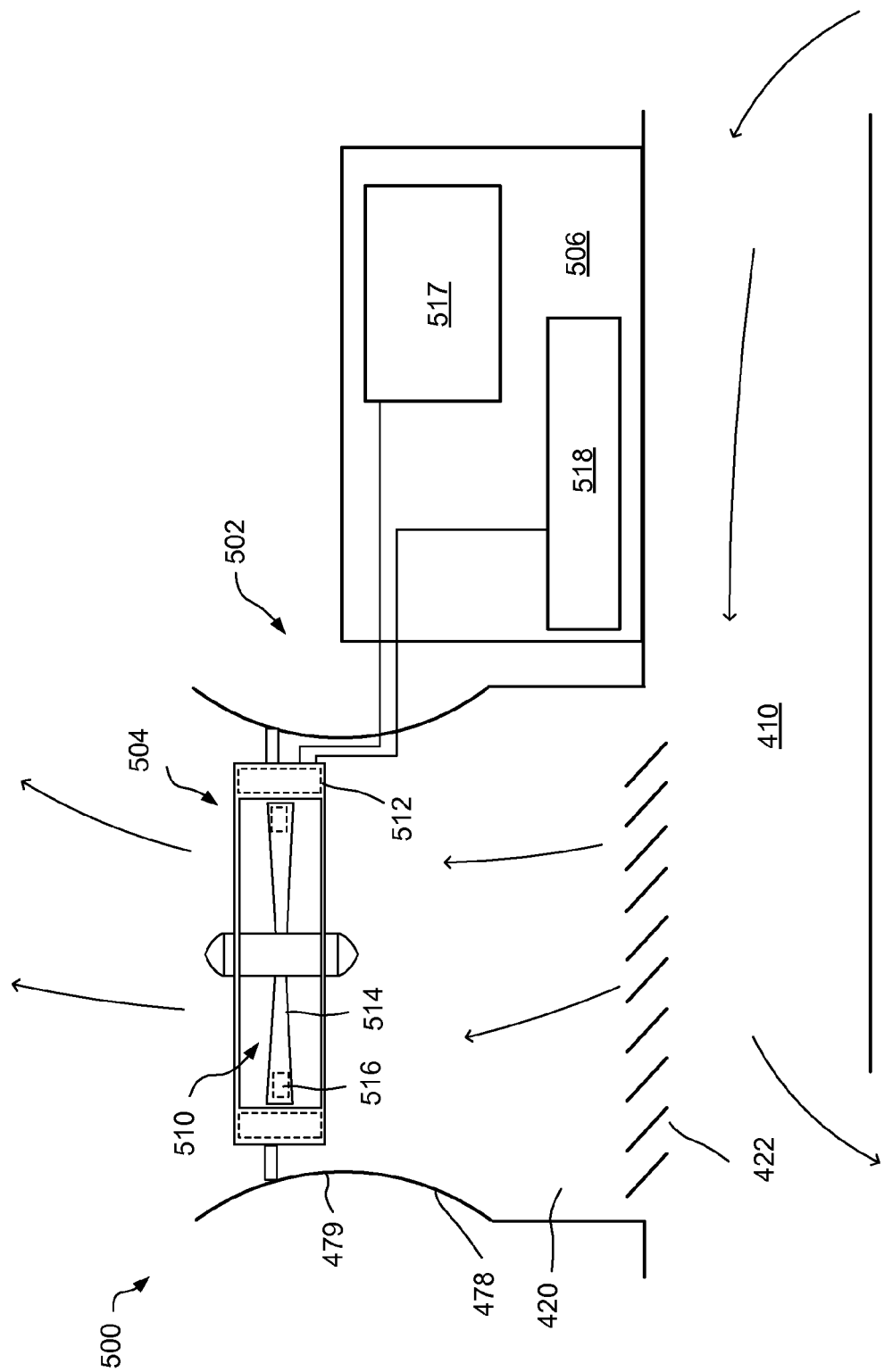
FIG. 2 illustrates one embodiment of an energy recovery system with a turbine system having a stator ring.

FIG. 2 illustrates one embodiment of an energy recovery system with a turbine system having a stator ring. System 500 includes turbine system 502. Turbine system 502 receives air flow that is exiting system an air handling system through exhaust duct 420. The air handling system may be similar to that described above relative to FIG. 1.

Turbine system 502 includes turbine 504 and turbine control unit 506. Turbine 504 includes rotor 510 and stator ring 512. Rotor 510 includes blades 514 and magnetic elements 516. Turbine control unit 506 includes control unit 517 and energy storage device 518. Energy storage device 518 may be an uninterruptible power supply.

As rotor 510 spins in response to air moving through turbine 504, motion of magnetic elements 516 relative to stator ring 512 may induce electrical current in stator ring 512. Energy generated by turbine 504 may be stored in energy storage device 518.

Figure 3:
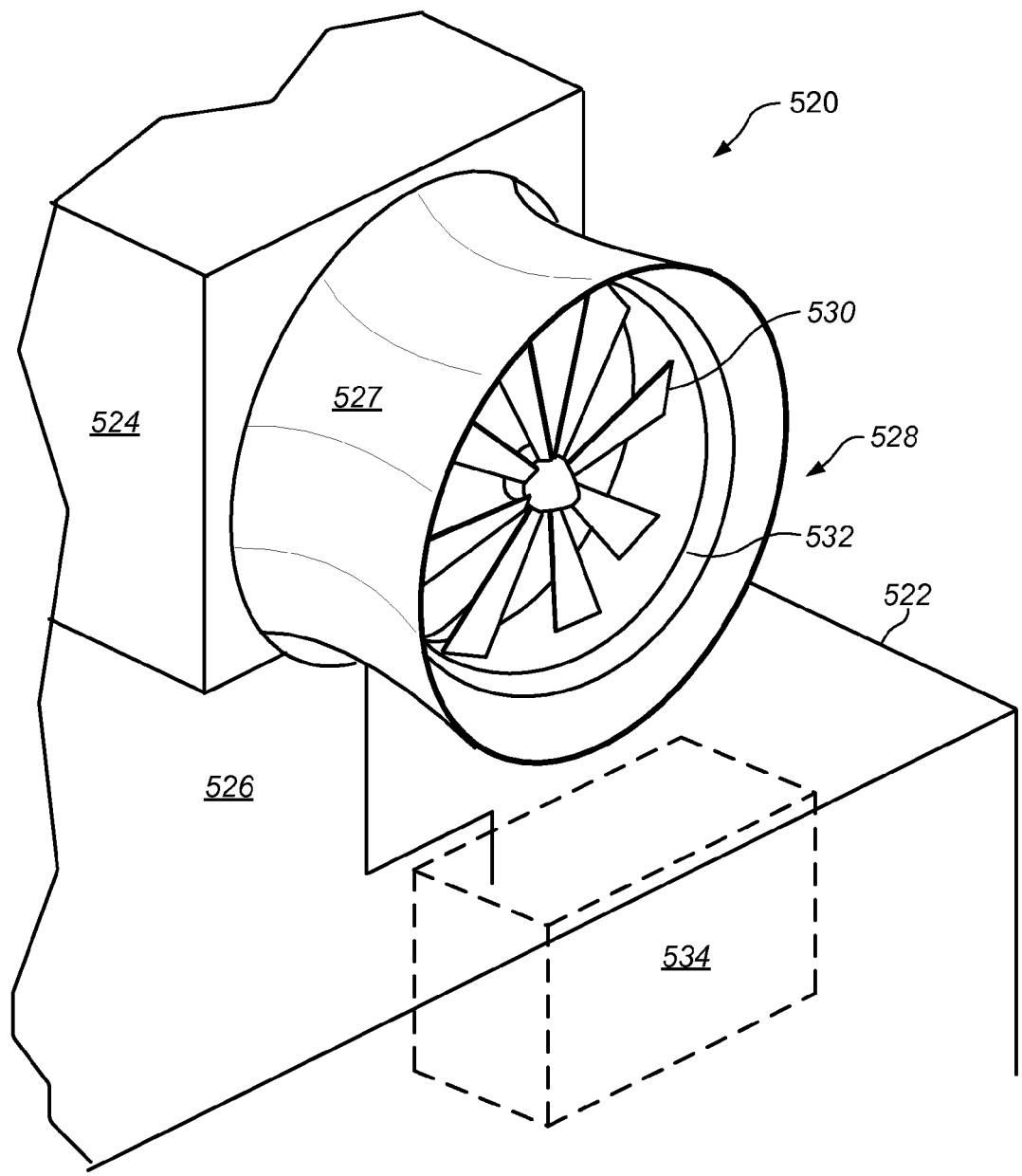
FIG. 3 illustrates a turbine system at a horizontal exhaust vent of a data center.

In some embodiments, a turbine system rotates in response to a horizontal air flow. FIG. 3 illustrates a turbine system at a horizontal exhaust vent of a data center. Data center 520 includes building 522. Exhaust plenum 524 of an air handling system in located on roof 526 of building 522. Air from the air handling system is expelled through duct 527. Turbine system 528 includes rotor 530, stator ring 532, and turbine control unit 534.

Rotor 530 may rotate in response to air flow through duct 527. Rotation of rotor 530 may generate electricity. The electricity may be stored in, for example, an energy storage device such as an uninterruptible power supply. The stored energy may be used to supply electrical power for systems in data center 520.

In some embodiments, a turbine system includes a mechanism for adjusting an orientation of its rotor. FIG. 4 illustrates a turbine system including a mechanism for adjusting the orientation of a rotor. Data center 540 includes air handling system 542 and turbine system 544. Air from air handling system 542 may be expelled through duct 420.

Turbine system 544 includes orientation mechanism 548 and turbine system control unit 550. Turbine system control unit 550 includes controller 552 and energy storage device 554. Orientation mechanism 548 may a motorized drive mechanism. Controller 552 may be operated to control the orientation of turbine 504. In certain embodiments, orientation of a turbine is controlled manually.

A turbine system mounting system may allow for orientation in any direction. In some embodiments, a turbine is mounted on a system that allows rotation in any axis, such as an eyeball mount. In certain embodiments, an orientation mechanism can adjust orientation of a turbine in two axes (for example, a pitch axis and a yaw axis relative to the direction of air flow).

In some embodiments, a turbine is oriented to increase rotation of its rotor (and thus the amount of electricity that can be generated). For example, a rotor may be tilted such that the axis of the rotor is better aligned with the direction of air flow. Position 555 shows an example of turbine 504 in a tilted orientation.

In some embodiments, a turbine is adjustable between a position or an orientation that enables electrical energy generation from air moved by an air handling system or an outdoor wind. For example, orientation mechanism 548 may be operated to adjust turbine 504 to position 556. In position 556, turbine 504 may generate electrical energy from wind blowing through turbine 504.

In some embodiments, turbine 504 is adjustable about a vertical axis when turbine 504 is in raised position 556. FIG. 5 is a top view of a data center illustrating adjustment of the orientation of a turbine about a vertical axis. If the wind is blowing the direction of the arrows, turbine 504 may adjusted from position 556*a* to position 556*b*.

Figure 6:
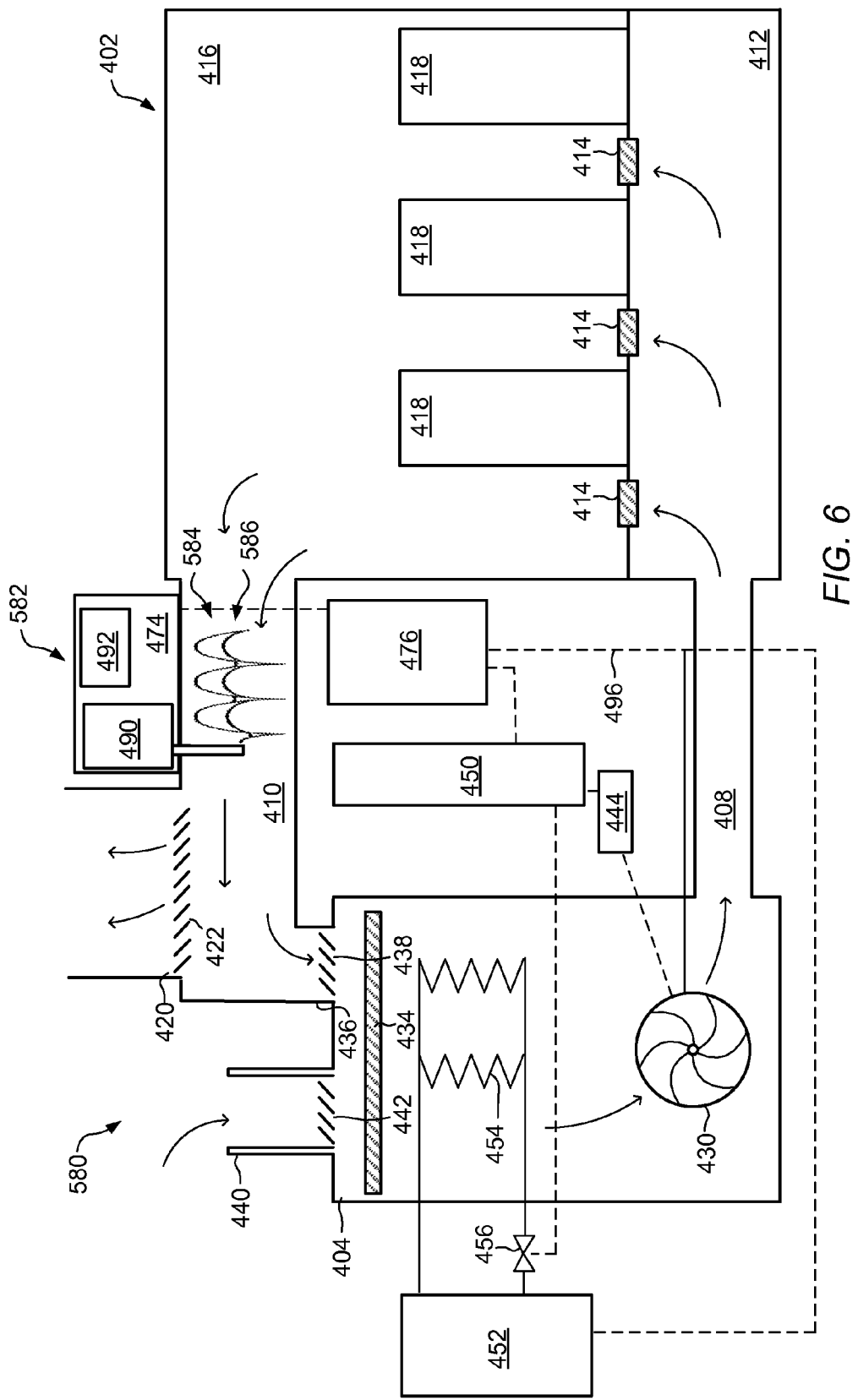
FIG. 6 illustrates one embodiment of a turbine system in an air flow passage in air handling system.

In some embodiments, a turbine is located in an air passage in an air handling system. The air passage may be part of a closed loop, such as a recirculation duct. FIG. 6 illustrates one embodiment of a turbine system in an air flow passage in air handling system. System 580 includes air handling system 402 and turbine system 582. Turbine system 582 includes turbine 584 in air passage 586. Air passage 586 may a portion of return duct 410, or a tube residing in return duct 410. In some embodiments, recirculation duct includes dampers that allow air exiting computer room 416 to be channeled through passage 586, to a bypass passage, or a combination thereof.

A rotor of turbine 584 may rotate in response to air flowing through return duct 410. Generator 490 may be operated to produce electricity from rotation of the rotor.

Figure 7:
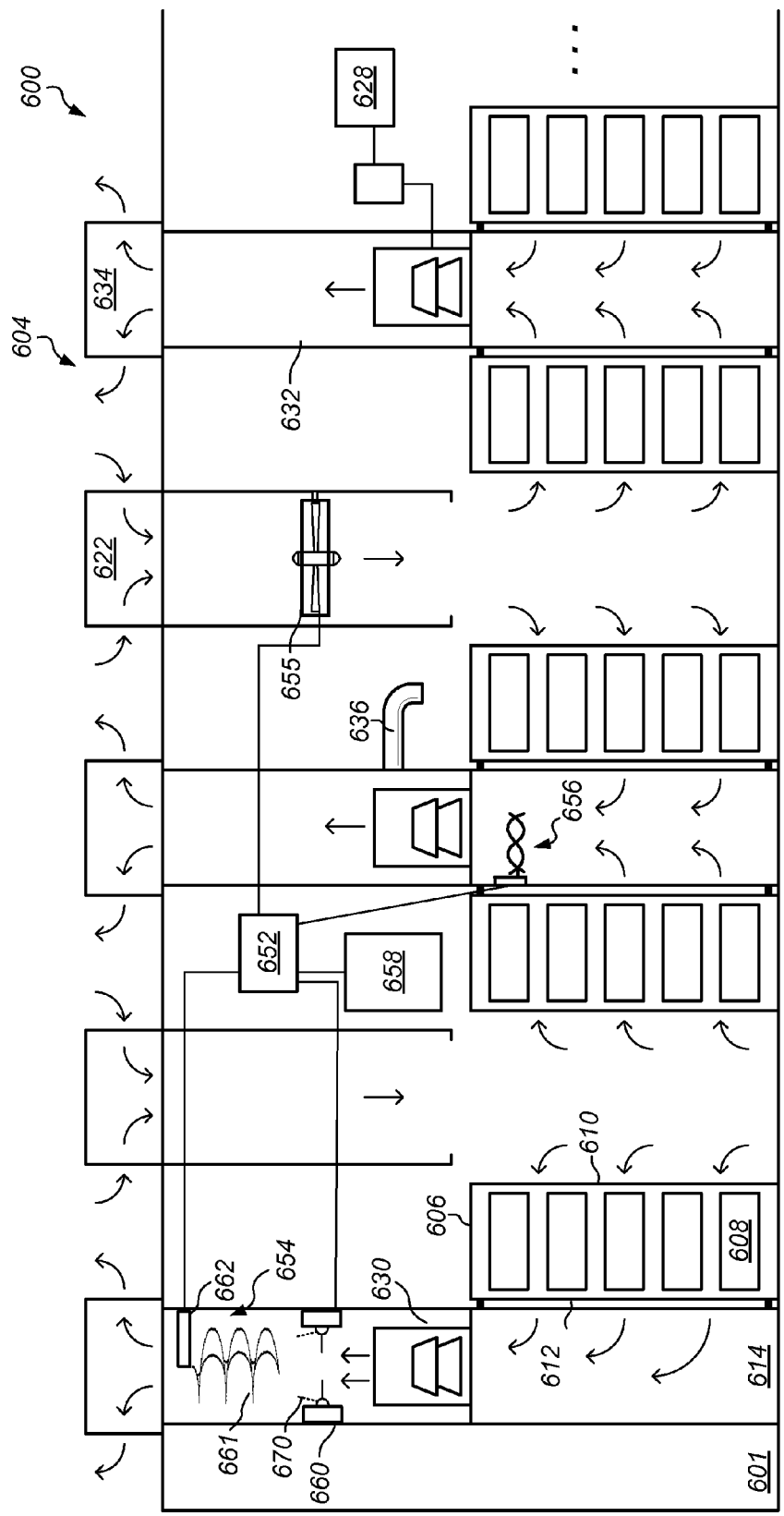
FIG. 7 illustrates one embodiment of a data center having turbine systems for recovering energy from moving air in the data center.

FIG. 7 illustrates one embodiment of a data center having turbine systems for recovering energy from moving air in the data center. Data center 600 includes room 601, rack computing systems 602, air handling system 604, and electrical power system 605. Each of rack computing systems 602 includes rack 606 and computing devices 608. Computing devices 608 may be mounted in racks 606. Racks 606 may include vents on front sides 610 of racks 606 and back sides 612 of racks 606. Vents in the racks may allow air flow through in either direction through the interior of racks 606, and through computing devices 608 held in racks 606.

Each of rack computing systems 602 may be positioned next to one of chambers 614. Each of chambers 614 may partially contain air exiting from racks 604 and segregate the air exiting the racks from other air in room 601. Chambers 614 may serve as a hot aisle for one of rack computing systems 602. Spaces in front of racks 606 may serve as cold aisles for rack computing systems 602.

Air handling system 604 includes air removal systems 620, intake vents 622, and control system 628. Each of air removal systems 620 includes air moving devices 630, duct 632, and exhaust roof vent 634. Although in FIG. 1 only one symbol is shown to represent air moving devices 630 for each air removal system, each of air removal systems 620 may include any number of air moving devices. In some embodiments, air moving devices are arranged in a row above a hot aisle, such as the hot aisle provided in chamber 614 of data center 600.

Air moving devices 630 may be operated to create negative pressure in chambers 614 relative to the air at the inlet openings in racks 606. In the system shown in FIG. 6, the air pressure at the inlets may match the ambient air pressure in room 601. The negative pressure in chambers 614 may draw air through racks 606 and through computing devices 608 installed in racks 606. Air moving devices 630 may pull heated air from the hot aisles and force the heated air through ducts 632.

Some or all of air removal systems 620 may include recirculation plenum 636. Recirculation plenum 636 may receive some of the air discharged into ducts 632. Recirculation plenum 636 may vent some air into room 601. Recirculated air from recirculation plenum 636 may mix with outside air introduced through intake vents 622. In some embodiments, air recirculated from an air removal system (such as air removal systems 620) is combined with outside air in a mixing plenum.

Control system 628 may be coupled to air moving devices 630 (in FIG. 1, control system 628 is shown connected to only one of air moving devices 630 for clarity) by way of variable frequency drives (VFDs) 640. Each of VFDs 640 may receive control signals from control system 628 and subsequently modulate a rotational velocity of a fan in one of air moving devices 630. In certain embodiments, an outside air damper, return air damper, exhaust damper, or combinations thereof, are modulated via a control system to modulate air flow.

Data center 600 includes energy recovery system 650. Energy recovery system 650 includes energy recovery control unit 652, exhaust duct turbine system 654, intake duct turbine system 655, hot aisle turbine system 656, energy storage device 658, and flow control mechanism 660. Intake duct turbine system 655 may be similar to turbine systems described above relative to FIGS. 1 and 2.

Exhaust duct turbine system 654 and hot aisle turbine system 656 each include rotors 661 and generators 662. Rotor 661 of exhaust duct turbine system 654 may rotate in response to air flow through duct 632. Rotor 661 of exhaust duct turbine system 656 may rotate in response to air flow through hot aisle 612. Generators 662 may generate electricity from rotation of rotors 661. Electricity generated by generators 662 may be stored in energy storage device 658. Energy stored in electrical energy storage device 658 may be used to supply electrical power to components in data center 600, such as air handling system 604.

In some embodiments, turbine system 654 and turbine system 656 include helical rotors. In various embodiments, the shaft of the helical rotors may be oriented in-line with the direction of flow, perpendicular to the direction of flow, or any other suitable angle.

Flow control mechanism 660 is coupled to energy recovery control unit 652. Flow control mechanism 660 includes movable vanes33 670. Flow control mechanism 660 may be controlled by energy recovery control unit 652 to alter flow to the rotors of turbine system 654. For example, flow control mechanism 660 may be operated to divert air flow to turbine system 654, reduce the effective cross sectional area of duct 632 to increase air velocity at the inlet of turbine system 654, or both.

In some embodiments, energy recovery control unit 652 operates flow control mechanism 660 to optimize generation of electricity by turbine system 654. As an example, energy recovery control unit 652 may operate flow control mechanism 660 to vary the flow of air to turbine system 654 based on a flow rate through duct 632. In certain embodiments, energy recovery control unit 652 operates flow control mechanism 660 to vary the flow to turbine system 654 based on a variable frequency drive for an air moving device generating air flow to a turbine system. In one embodiment, flow control mechanism 660 may be operated based on the frequency of a variable frequency drive for air moving device 630 moving air across turbine system 654. For example, if the operating frequency of variable frequency drive is reduced from 60 Hz to 30 Hz, flow control mechanism 660 may be operated to reduce the effective cross sectional area at the inlet of turbine system 654 to maintain velocity of airflow to turbine system 654.

Figure 8:
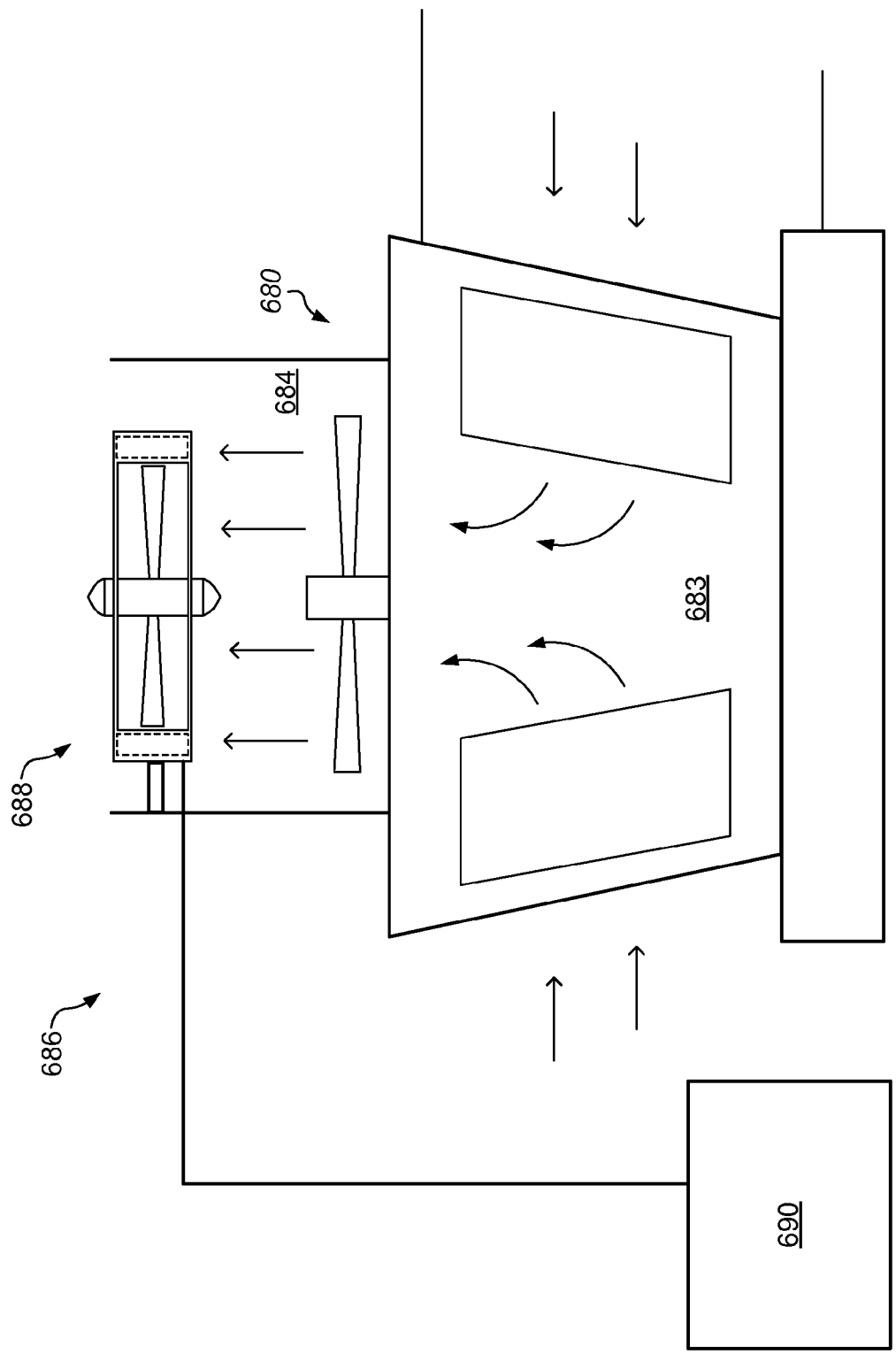
FIG. 8 illustrates one embodiment of an energy recovery system installed on a cooling tower.

FIG. 8 illustrates one embodiment of an energy recovery system installed on a cooling tower. The cooling tower may be part of a cooling system for a data center or building, such as cooling system 400 described above relative to FIG. 1. Cooling tower 680 includes fan 682. Fan 682 may draw air through evaporator section 683 and expel the air into duct 684.

Energy recovery system 686 includes turbine 688 and energy storage device 690. Turbine 688 may generate electricity in response to air flowing through turbine 688. Energy generated in turbine 688 may be stored in energy storage device 690.

Figure 9:
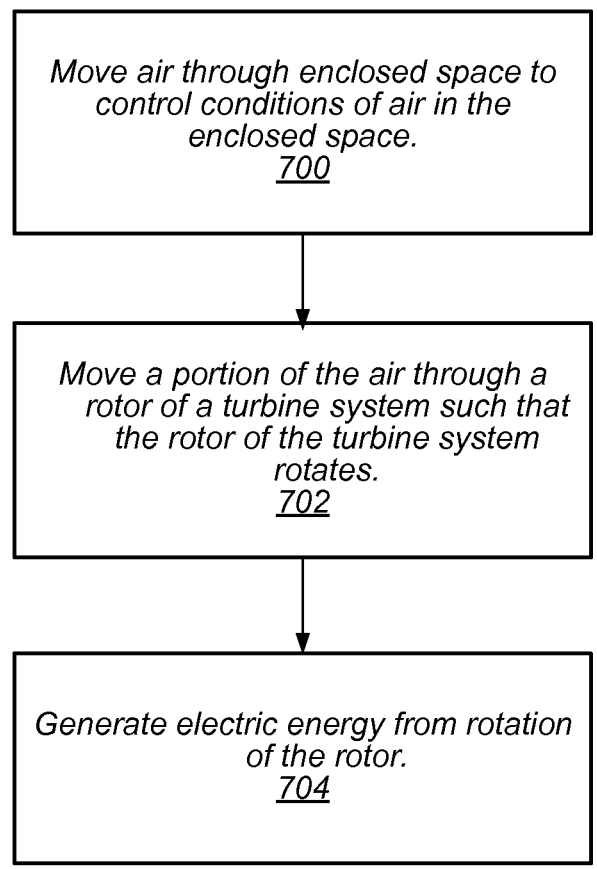
FIG. 9 illustrates use of a turbine system to reclaim energy from air moving in a space.

FIG. 9 illustrates energy reclamation from air moving in a space using a turbine system. At 700, air is moved through an enclosed space to control conditions of the air in the enclosed space. The enclosed space may be, for example, a computing room of a data center. The air may be used to remove heat from heat producing components in the room.

At 702, air is moved through a rotor of a turbine system such that a rotor of the turbine system rotates. In some embodiments, the rotor of the turbine system is at or near an exhaust of an air handling system to outside air. In some embodiments, the rotor of the turbine system is in an air passage (for example, a return air duct) of an air handling system. In cetain embodiments, the orientation of the rotor is adjusted to increase rotation (for example, aligning the axis of the rotor with the direction of air flow.

At 704, electricity is generated from rotation of the rotor. In some embodiments, the energy produced is stored in a back-up power supply system, such as a UPS. The stored energy may be used to supply power to electrical systems. In certain embodiments, the stored energy is used as a back-up power source for a cooling system.

In some embodiments, a data center includes an air removal system that creates a negative pressure in a hot aisle to pull air through computing devices in the data center. In some embodiments, a data center includes pods of rack computing systems arranged in one or more rows and columns. In some embodiments, elements of an air removal system may be shared among two or more pods in a data center.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    a computing room;
    a plurality of computing devices in the computing room;
    an air handling system configured to move air, wherein at least a portion of the air moved by the air handling system flows across heat producing components in at least some of the computing devices in the computing room; and
    a turbine system coupled to the air handling system, wherein the turbine system comprises a rotor configured to rotate in response to at least a portion of the air moved by the air handling system;

wherein the turbine system is configured to:
   change an orientation of the rotor relative to an air stream moving across the rotor; and
   generate electricity from rotation of the rotor.

2. The data center of claim 1, wherein to change the orientation of the rotor relative to the air stream moving across the rotor, the turbine system is configured to reposition the turbine system such that the rotor rotates in a natural wind.

3. The data center of claim 1, wherein to change the orientation of the rotor relative to the air stream moving across the rotor, the turbine system is configured to adjust the orientation of the turbine system about a pitch axis or a yaw axis.

4. The data center of claim 1, wherein to change the orientation of the rotor relative to the air stream moving across the rotor, the turbine system is configured to adjust between an orientation aligned with a direction of air flowing via the air handling system and an orientation aligned with a direction of air flowing via a natural wind.

5. The data center of claim 1, further comprising:
   a control system configured to operate the turbine system; and
   one or more energy storage devices, wherein at least one of the energy storage devices is configured to:
      store energy generated by the turbine system; and
      supply electrical power to the one or more components in the data center using the stored energy;
   wherein the control system is configured to supply electrical power from the energy storage devices based on one or more conditions in the data center.

6. A system, comprising:
   one or more rooms;
   an air handling system configured to move air through at least one of the one or more rooms; and
   a turbine system coupled to the air handling system, wherein the turbine system comprises a rotor, wherein the rotor of the turbine system is configured to rotate in response to at least a portion of the air moved by the air handling system;
   wherein the turbine system is configured to:
      change an orientation of the rotor relative to an air stream moving across the rotor; and
      generate electricity from rotation of the rotor.

7. The system of claim 6, wherein to change the orientation of the rotor relative to the air stream moving across the rotor, the turbine system is configured to reposition the turbine system such that the rotor rotates in a natural wind.

8. The system of claim 6, wherein to change the orientation of the rotor relative to the air stream moving across the rotor, the turbine system is configured to adjust the orientation of the turbine system about a pitch axis.

9. The system of claim 6, wherein to change the orientation of the rotor relative to the air stream moving across the rotor, the turbine system is configured to adjust the orientation of the turbine system about a yaw axis.

10. The system of claim 6, further comprising a ball mount; wherein the turbine system is coupled to the air handling system at least in part by the ball mount; wherein the ball mount is configured to allow adjustment of the turbine system about three or more axes.

11. The system of claim 6, wherein the rotor of the turbine system is located in an exhaust air flow from the air handling system.

12. The system of claim 6, wherein to change the orientation of the rotor relative to the air stream moving across the rotor, the turbine system is configured to adjust the orientation of the turbine system between an orientation aligned with a direction of air flowing via the air handling system and an orientation aligned with a direction of air flowing via a natural wind.

13. The system of claim 6, wherein the turbine system is configured to be manually adjusted to change the orientation of the rotor relative to the air stream moving across the rotor.

14. The system of claim 6, further comprising one or more energy storage devices, wherein at least one of the energy storage device s is configured to:
   store energy generated by the turbine system; and
   supply electrical power using the stored energy.

15. The system of claim 14, further comprising a control system, wherein the control system is configured to operate the turbine system to generate electricity or supply electrical power in response to one or more conditions of the room or the air handling system.

16. The system of claim 15, wherein the control system is further configured to adjust the orientation of the turbine system between an orientation aligned with a direction of air flowing via the air handling system and an orientation aligned with a direction of air flowing via a natural wind, in response to the one or more conditions of the room or the air handling system, or in response to one or more conditions of the natural wind.

17. A method, comprising:
   moving air through an enclosed space to control conditions of the air in the enclosed space;
   moving at least a portion of the air through a rotor of a turbine system such that the rotor of the turbine system rotates;
   generating electrical power from rotation of the rotor; and
   changing orientation of the rotor relative to an airflow to promote rotation of the rotor and to continue generating electrical power from rotation of the rotor.

18. The method of claim 17, further comprising adjusting the turbine system between an orientation aligned with the air of the air stream and an orientation aligned with a direction of additional air flowing via a natural wind.

19. The method of claim 17, further comprising storing at least a portion of the electrical energy generated from the turbine system.

20. The method of claim 19, further comprising supplying electrical power from the stored electrical energy to a cooling system for the enclosed space.

* * * * *